United States Patent [19]
Whitmarsh et al.

[11] Patent Number: 5,507,017
[45] Date of Patent: Apr. 9, 1996

[54] CONTROL OF ATTENUATION AND AMPLIFICATION IN FOWARD AND FEEDBACK PATHS FOR POWER CONTROL FOR CARTESIAN AMPLIFIERS

[75] Inventors: William J. Whitmarsh, Chelwood; Simon M. Whittle, Bath; Ian S. Parry, Ham, all of United Kingdom

[73] Assignee: Linear Modulation Technology Limited, United Kingdom

[21] Appl. No.: 298,946

[22] Filed: Aug. 31, 1994

[30] Foreign Application Priority Data

Sep. 29, 1993 [GB] United Kingdom ............... 9320078

[51] Int. Cl.[6] ................................................ H04B 1/04
[52] U.S. Cl. ........................ 455/126; 455/127; 330/85; 330/291
[58] Field of Search ........................... 455/115, 116, 455/119, 126, 127, 69, 234.1, 234.2; 330/278, 284, 291, 85

[56] References Cited

U.S. PATENT DOCUMENTS

| | | | |
|---|---|---|---|
| 5,066,922 | 11/1991 | Leitch | 455/126 X |
| 5,066,923 | 11/1991 | Gailus et al. | |
| 5,128,629 | 7/1992 | Trinh | |
| 5,208,550 | 5/1993 | Iwane | 455/126 X |
| 5,212,814 | 5/1993 | Iwane | 455/126 X |
| 5,214,393 | 5/1993 | Aihara | 455/126 X |

FOREIGN PATENT DOCUMENTS

| | | |
|---|---|---|
| 0397401 | 11/1990 | European Pat. Off. |
| 0546693 | 6/1993 | European Pat. Off. |
| 62-139425 | 12/1985 | Japan ............... 455/126 |

OTHER PUBLICATIONS

Patent Abstracts of Japan, vol. 17, No. 583 (E-1452) 13 Jul. 1993 & JP-A-05 175 771 (Fujitsu).
British Search Report dated 27 Oct. 1994 (3 pages).

*Primary Examiner*—Chi H. Pham
*Attorney, Agent, or Firm*—Harness, Dickey & Pierce

[57] ABSTRACT

A Cartesian amplifier is provided with a means of controlling its output power comprising a controllable attenuator in the amplifier forward path and a controllable amplifier in the feedback path. A control signal representing the required power level is applied to the attenuator and controllable amplifier and, in response thereto, the degrees of attenuation and amplification are varied in inverse proportion to one another.

13 Claims, 3 Drawing Sheets

CONTROL OF ATTENUATION AND AMPLIFICATION IN FOWARD AND FEEDBACK PATHS FOR POWER CONTROL FOR CARTESIAN AMPLIFIERS

BACKGROUND OF THE INVENTION

1. Field of the Invention

The present invention relates to a technique for controlling the power output of an amplifier, in particular that of a Cartesian amplifier without causing distortion to the wanted signals i.e. the signals being amplified. The power control is applied by varying the forward and reverse path gains of the Cartesian loop.

A description of the operation of a linearised amplifier based on the Cartesian loop is given in our U.S. Pat. No. 5,381,108 entitled "Automatic Calibration of the Quadrature Balance within a Cartesian Amplifier". This shows how the loop uses modulation feedback to reduce the unwanted intermodulation products in the RF output.

Power control can provide significant advantage in a mobile radio environment (to which Cartesian amplifiers have found application). By reducing the transmit power to the minimum for good communications, co-channel and adjacent channel interference can be reduced and battery life in hand portable equipment can be extended. Thus a method that allows efficient power control for a Cartesian amplifier without interfering with the wanted signal or the performance of the loop is highly desirable.

Conventional power control can be applied in two ways. Firstly, a power attenuator can be used on the output of the amplifier, but this is wasteful of both power and hardware. Secondly, direct control of the amplifier output can be used by, for instance, controlling the supply voltage fed to it or by controlling any bias current. Controlling the amplifier output is of little use in the case of a Cartesian amplifier as the loop will always compensate for a reduction in amplifier gain by increasing the drive level. This would result in the amplifier being overdriven, causing a significant increase in distortion.

In the case of a linear amplifier, such as results from the application of a Cartesian loop, power control can be applied by reducing the drive level at the input to the amplifier system. This requires that the dynamic range of the modulating signal be extended to include the power control range. A number of factors limit the dynamic range of a Cartesian loop; noise and pick-up effects and, more importantly, the unwanted carrier output from the amplifier. This second effect is due to DC offsets in the baseband circuitry within the loop. Any offsets appearing at the output of the differential amplifier will result in carrier appearing at RF. Because the carrier is in the centre of the RF output frequency spectrum, it will interfere with the wanted signal if it is too large. Methods do exist for reducing DC offsets, but achieving very low levels for long periods of time is difficult and the residual carrier output limits the dynamic range of the Cartesian amplifier.

The transfer function of a feedback amplifier is of the general form $$\frac{Y(t)}{X(t)} = \frac{K}{1+KH}$$

Where K and H are the forward and reverse path transfer functions respectively and KH represents the loop gain.

It is evident that power control which is inversely proportional to the level of some power control signal can be achieved by varying the gain in the feedback path.

However this approach means that the loop gain varies in direct proportion to the gain in the reverse path. Thus the loop must be designed to be stable at the highest level of loop gain which occurs at the lowest power output. It must also be designed with sufficient loop gain at the highest power output to reduce any unwanted non linear distortions from the power amplifier.

Thus, compared with an amplifier without power control, this simple form of power control requires the use of a more linear power amplifier for any given loop configuration and required output linearity.

As the drive level to a Cartesian loop is altered, the transistor in the power amplifier will be driven to different portions of its characteristic operating curve. This will result in a variation of its average gain with drive level. Any resulting change in the forward gain can effect the power control methods described above.

In the approach described above, no attempt is made to compensate the loop gain as power control is applied. This means that no compensation for the response of the power amplifier can be made. Typically the gain of the amplifier will reduce as the signal level increases and the transistor approaches saturation. In the other direction the loop gain will be increased by the power amplifier at low output power levels. This tends to extend further the stability margin required to operate power control in this way.

SUMMARY OF THE INVENTION

The only way that the power amplifier response can be used to advantage is if its gain reduces with reducing output power. This is the case at low drive levels when the transistor is not biased into a linear region (such as when operating class C). Such responses can be used to reduce the loop gain at low output powers. It must be remembered, however, that the stability of the Cartesian loop is dependent on the worst combination of loop gain and power amplifier characteristic. This will always occur at some point in the power control characteristic.

According to the present invention, there is provided a power amplifier comprising an input terminal for receiving a signal to be amplified, a forward amplification path having a power amplifier output stage, a feedback path and means for controlling the output power of the output stage, comprising means for controlling in a coordinated manner the degree of attenuation of signals in the forward path and the degree of amplification in the feedback path, in accordance with a signal representing the required output power level.

As described below, the amplifier of the invention may be used in FDM (Frequency Division Multiplexing), TDM (Time Division Multiplexing) and CDM (Code Division Multiplexing) communication systems, in particular trunked radio systems. The invention thus further provides FDM, TDM and CDM communication systems incorporating one or more transmitters using the amplifier of the invention.

The invention will be further described by way of non-limitative example with reference to the accompanying drawings, in which:

DESCRIPTION OF THE PREFERRED EMBODIMENT

Figure 1:
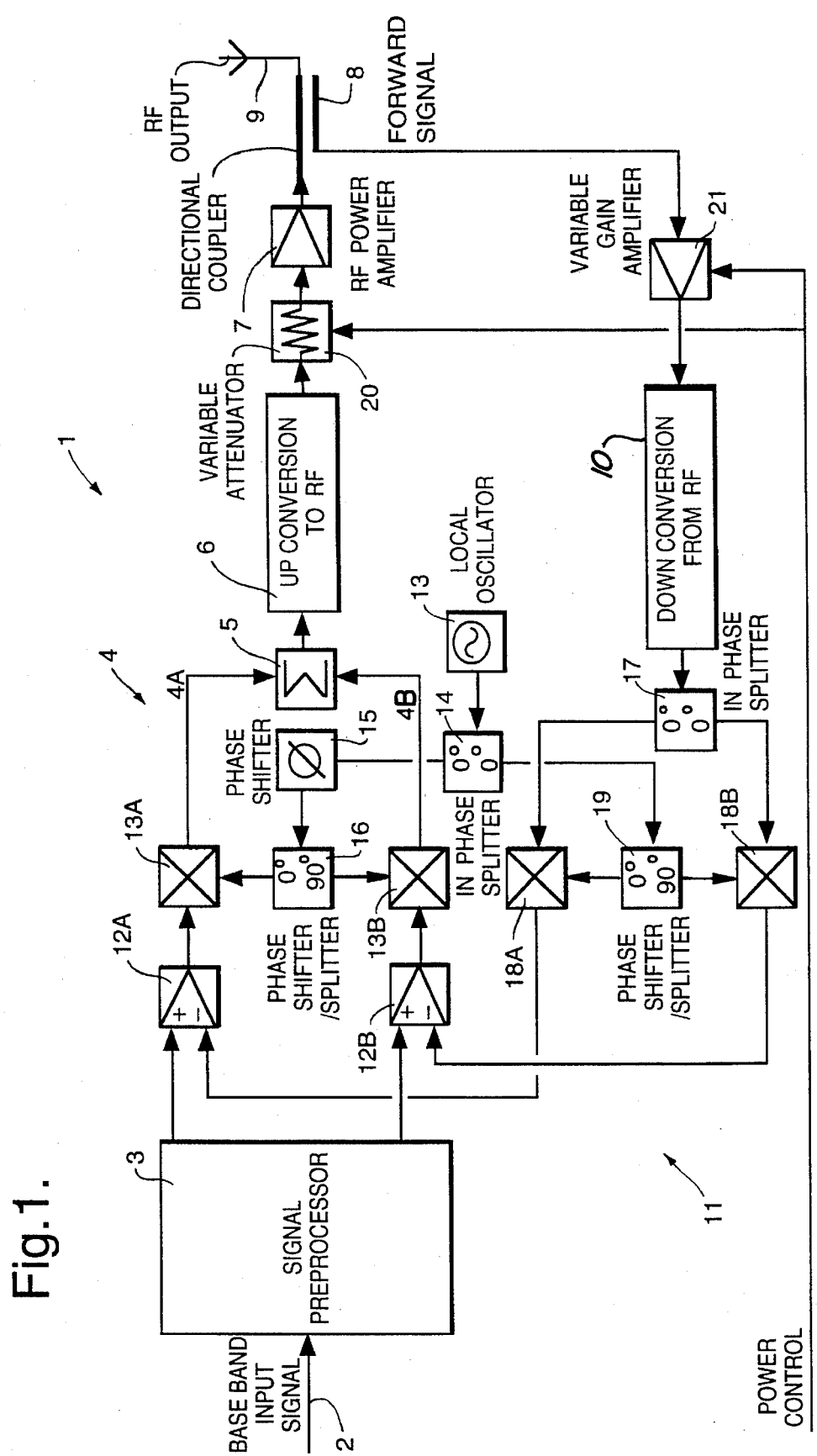
FIG. 1 illustrates in block form a first embodiment of a Cartesian amplifier according to the present invention.

FIG. 1 illustrates, in block diagram form, a Cartesian loop amplifier embodying the present invention. An input signal to be transmitted is applied to the input terminal 2 of a signal pre-processor 3 which when operating in a first, transmission mode, pre-processes the signal to apply a linearising pre-distortion to it and, resolves it into two quadrature ("real" and "imaginary") components in two separate channels which are then applied to respective forward paths 4A, 4B of an error amplifier 4. As described in our patent referred to above the pre-processor 3 is also operable in a second, calibration, mode in which it applies a series of test signals to the two inputs of the forward paths 4A, 4B which are used to derive values used in pre-distorting the input signal to improve linearity. The outputs of the paths 4A and 4B are summed by a summing circuit 5 and then subjected to up-conversion to RF by a modulator 6. The up-conversion to RF can be either direct or via one or more stages of conversion via intermediate frequencies (IF). The form of RF signal is not directly relevant to the present invention, but it is noted that the embodiment of FIG. 1 was devised for production of a single sideband, suppressed carrier mobile radio signal.

The invention is also applicable to other types of radio transmission in particular so called code division multiple access (spread spectrum) systems, in which optimising transmission power is an important concern, requiring the transmission power to be within 1dB of its optimum value.

The signal resulting from the frequency up conversion by modulator is applied via a variable attenuator as the drive signal to the input of an RF power amplifier 7. The purpose of the Cartesian loop is to linearise the amplification of an input signal between the input to the pre-processor and the output of this power amplifier 7.

A directional coupler 8 is used to apply the output of amplifier 7 to an antenna 9 for transmission and to obtain a sample of the output which is used to drive the feedback part of the Cartesian loop.

This sampled signal is passed through a variable gain amplifier 21 and is frequency down-converted back to baseband by a frequency down-converter 10 which may be implemented by any suitable demodulating circuitry and the resulting signal is then processed, by circuitry described below, so as to resolve it into two quadrature feedback signals which are used to apply respective corrections to the signals passing through the two parallel forward paths 4A, 4B of the error amplifier 4. As with the frequency up-conversion, the frequency down-conversion may be direct from RF to baseband or via one or more stages of intermediate frequency conversion. The demodulation needless to say, should be the inverse of the modulation applied in the up-conversion.

The two forward paths 4A, 4B include, as a first stage, amplifiers 12A, 12B which respectively receive the real and imaginary quadrature components of the preprocessed input signal from terminal 1 and the corresponding one of the two quadrature components from the feedback path 11 and produces an output equal to the difference between those components.

The difference signals for the real and imaginary components from the amplifiers 12A, 12B are applied to respective mixers 13A, 13B where they are mixed with signals derived from the output of a local oscillator 13.

The output of oscillator 13 passes through power splitter 14 which divides the signal between the forward and reverse paths of the Cartesian loop. In the forward path, a phase shifter 15 provides compensation for delays around the Cartesian loop so that negative feedback at the error amplifier is ensured. The output from the phase shifter 15 passes through a 0°/90° phase shifter/splitter 16 so that the signals from amplifiers 12A and 12B are mixed with two sinusoidal signals from the output of oscillator 13 which are 90° phase shifted relative to one another. This achieves a quadrature up-conversion of the output of amplifiers 12A and 12B.

In the feedback path, the output of the frequency down-converter 10 is applied to the input of a 0°/0° phase splitter 17. The outputs from phase splitter 17 are applied to two mixers 18A, 18B where they are mixed with two signals, phase shifted 90° relative to one another derived by phase shifter/splitter 19 and phase splitter 14 from the local oscillator 13. The outputs of the mixers 18A, 18B are applied to the inverting inputs of amplifiers 12A, 12B, as representing quadrature components at baseband of the output of amplifier 7.

The signal preprocessor is used to predistort the real and imaginary quadrature drive signals applied to the Cartesian loop forward path so as to reduce distortion and improve linearity.

The provision of the variable attenuator 20 in the forward path prior to the RF power amplifier and the variable gain amplifier 21 in the reverse path enables transmission power control without requiring a large modulation dynamic range and without causing distortion.

The degree of attenuation of the attenuator 20 and the gain of variable gain amplifier 21 may be stepped or, more preferably, continually variable.

Figure 2:
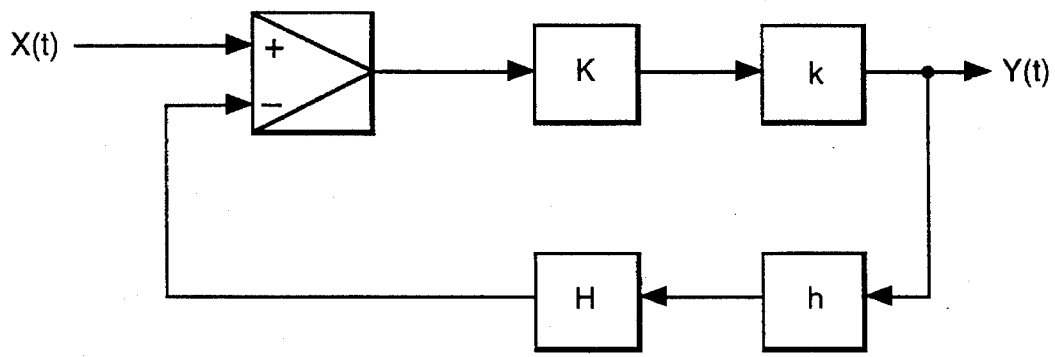
FIG. 2 is a simplified representation of the amplifier of FIG. 1.

To explain the operation of the power control, consider the simplified baseband equivalent diagram shown in FIG. 2. Here K and H are the complex forward and reverse path gains, respectively, for the Cartesian loop. In addition, k and h are the real gains associated with the variable attenuator 20 and the variable gain amplifier 21 respectively. The loop equation for a Cartesian amplifier, without k and h, is given by the simple feedback loop equation:

$$\frac{Y(t)}{X(t)} = \frac{K}{1+KH}$$

where X(t) is the input to the Cartesian loop and Y(t) is the output, both of which are represented as complex signals. If the terms k and h are added, the equation becomes:

$$\frac{Y(t)}{X(t)} = \frac{Kk}{1+KHkh}$$

Evidently, the gain of the Cartesian amplifier can be varied by altering the values of k and h. Typically KHkh is much greater than unity, so the gain of the amplifier system will be inversely proportional to Hh.

By examining the loop gain of the system, it is possible to find a constraint on the gains k and h. The loop gain if given by the forward gain multiplied by the reverse gain, i.e.:

*loopgain=|KHkh|*

Loop gain is a critical design parameter for a Cartesian loop. In practice loop components display a frequency-dependent response. Of particular note is the response of the phase shifter which compensates for delay around the loop by applying a phase shift to the local oscillator in either the forward or reverse path. This phase shift will only compensate for the delay over a limited bandwidth. As the loop gain is increased it is found that the system is more prone to instabilities and oscillation due to non ideal components and non-flat frequency responses.

The linearisation achieved by the loop is dependent on the loop gain. As the loop gain is increased the distortions due to the power amplifier will reduce. Thus the loop gain should be calculated as the best compromise between stability and linearisation. In any one implementation, it is desirable to keep the loop gain at a constant level, which means that k and h are limited by the relationship:

$$k \alpha \frac{1}{h}$$

In summary, the gain of the Cartesian amplifier, and thus the output power can be controlled by varying the reverse gain with the term h. The loop gain can then be controlled by applying a forward gain k, in the up-converter. To achieve a fixed loop gain, k must be inversely proportional to h.

Considering FIG. 1, power control is achieved by applying a continuous control signal to the variable gain amplifier 21 in the reverse path. The same control signal is applied to a variable attenuator 20 in the forward path. The variable attenuator 20 is designed to give a response to the control signal which is inversely proportional to that of the variable gain amplifier 21. As the level of the control signal and hence the gain of the variable gain amplifier 21 is increased, the power output of the Cartesian loop will reduce by the number of decibels that the reverse gain increases.

The particular advantage of this method is that power control is applied without affecting the wanted modulation. As more power control is applied, both the unwanted carrier output from the Cartesian loop and the effect of the noise floor in the system will tend to fall. Thus the extent of power control is not limited by the dynamic range of the Cartesian loop circuitry.

It is possible to vary the terms k and h in relationships other than that above. This will result in the loop gain changing as the amount of power control is varied.

Figure 3:
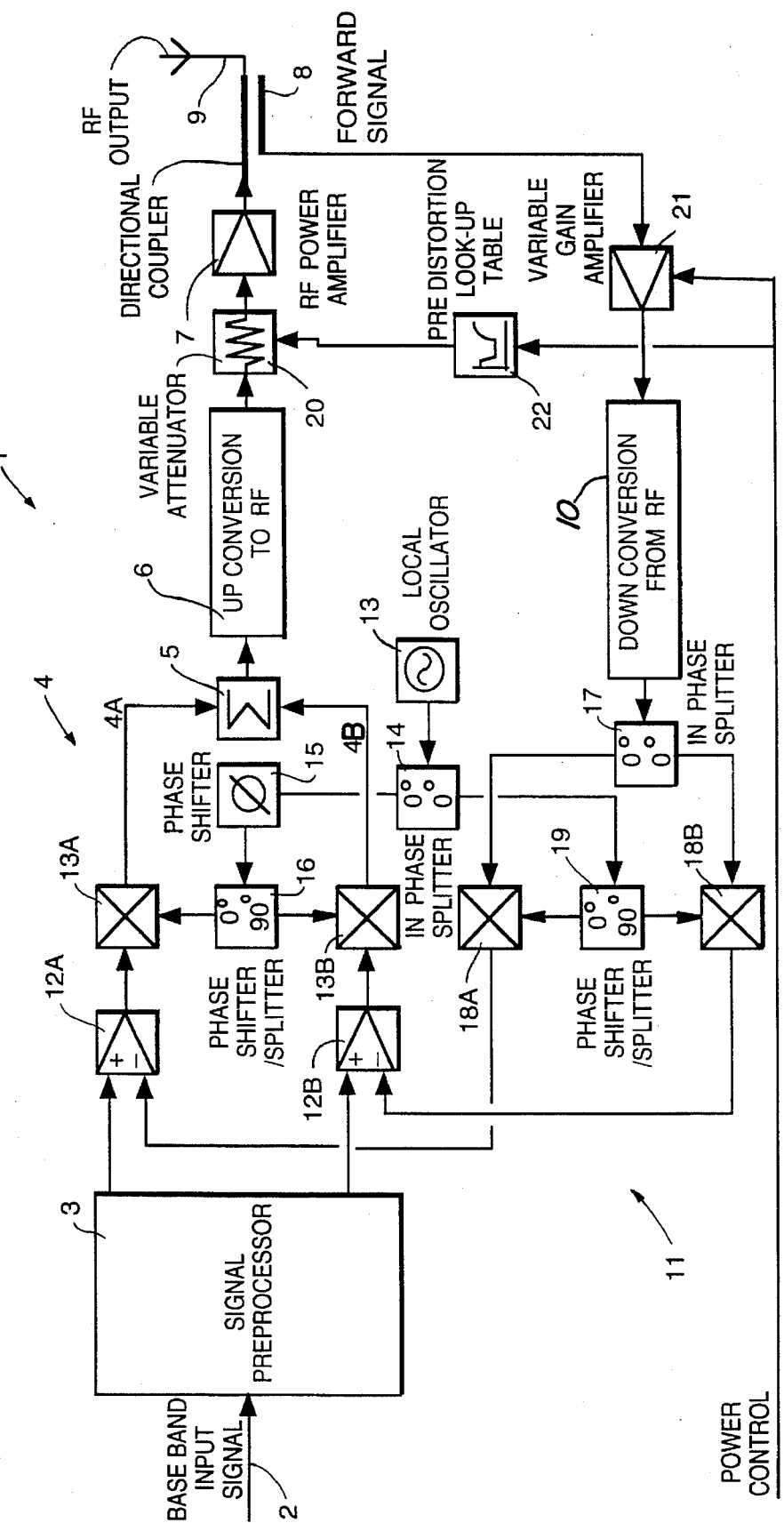
FIG. 3 illustrates a second embodiment of the invention.

In the illustrated embodiment of the invention, the forward gain k, is adjusted to maintain a constant loop gain. Variation in the power amplifier gain will tend to alter the loop gain and the optimal solution is to vary k to compensate for changes in the amplifier gain. One way to achieve this is to predistort the power control signal before application to the variable attenuator 20. This is shown in the embodiment of FIG. 3. Here, a predistortion look-up table 22 is used to convert the power level control signal to a suitable corresponding gain control signal for the variable attenuator 20.

A method for implementing power control in a Cartesian loop has been described. This allows the output of the loop to be controlled without affecting the loop gain so that the stability margin is not changed. The method does not cause distortion to the modulation and does not rely on a wide modulation dynamic range around the loop. Additionally, it is implemented in such a way that the ratio of any unwanted carrier to wanted signal remains constant.

As in our U.S. Pat. No. 5,381,108 referred to above, the output of the directional coupler may be processed (e.g. by rectification and time averaging) to derive a signal representative of the amplifier output power. This signal may be utilised by the power controller of the present invention to adjust the output power to a required level.

Inter alia, the amplifier of the present invention is applicable to RF transmission in trunked radio systems using FDM (Frequency Division Multiplexing) and TDM/TDMA (Time Division Multiplexing and Time Division Multiple Access) or CDM/CDMA (Code Division Multiplexing/Code Division Multiplexed Access) systems.

In an FDM system, a region of the RF spectrum, for example 25 KHz wide, might be split into five adjacent channels each 5 KHz wide and carrying different voice or data communications. In such a system, individual amplifiers, each embodying the invention, may be used to transmit the signals of the individual voice/data channels.

In a TDM or TDMA system, a number of input voice or data signals are cyclically sampled and division multiplexed into successive slots of TDM signal which is then up-converted to RF and may be transmitted using an amplifier embodying the invention.

In a so-called Code Division Multiplexed Access (CDMA) system, a number of relatively narrow-band base-band signals are modulated to RF to share a wider-band channel at RF. This is achieved by multiplexing each of the baseband signals by a unique binary "spreading" code, which spreads the spectrum of the signal across the RF channel.

Figure 4:
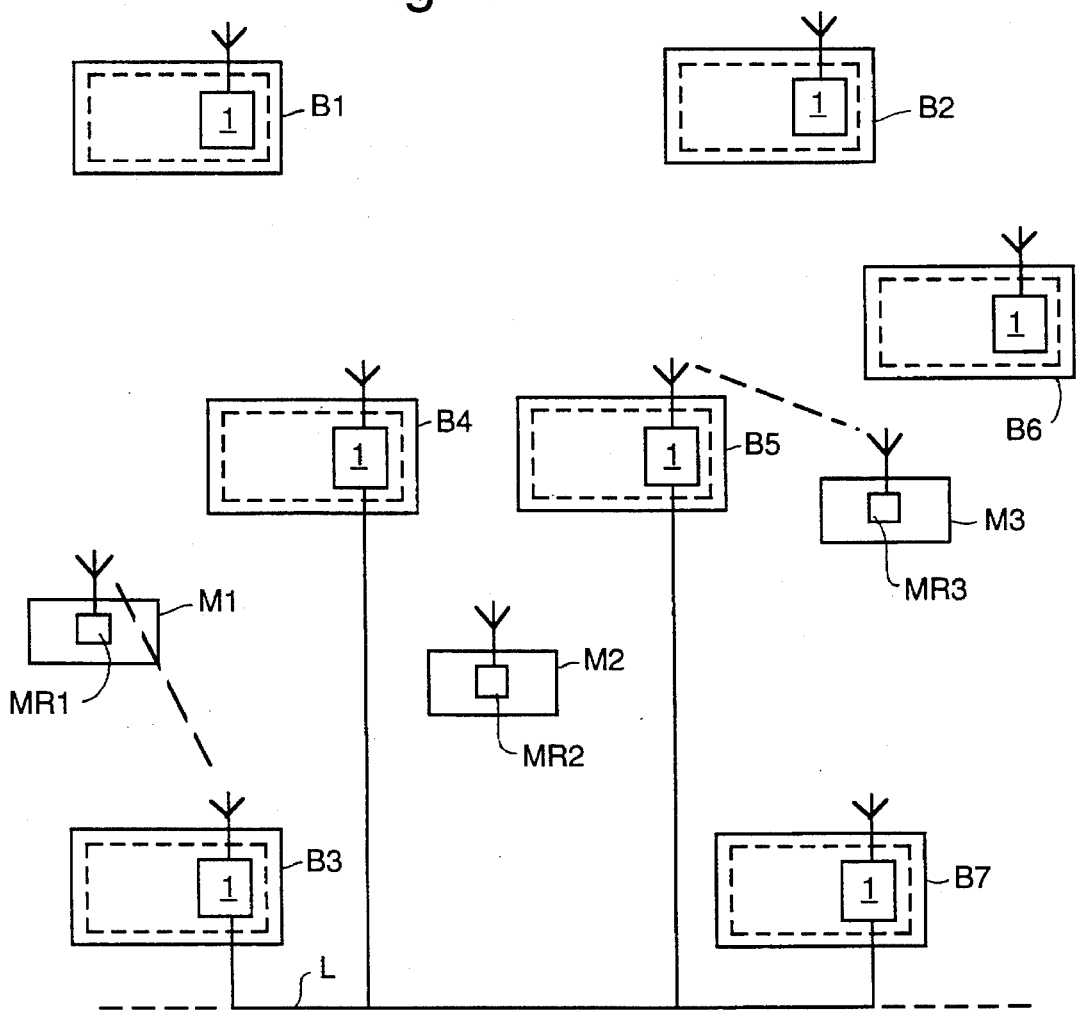
FIG. 4 illustrates a trunked radio network in which transmitters incorporating amplifiers according to the invention are used.

FIG. 4 illustrates a trunked radio network using FDM, TDM or CDM for two-way communication in which a number of base stations B1—BN having one or more transmitters and receivers are geographically distributed to facilitate communication between mobiles (e.g. road vehicles) M1—MM equipped with two-way radios MR1—MRM. Any or all of the base stations B1—BN and/or mobiles are equipped with one or more transmitters incorporating an RF power amplifier 1 embodying the invention (these may for example be in accordance with FIG. 1 or FIG. 3) for amplifying the trunked radio signals for transmission. FIG. 4 shows a two-way communication between mobiles M1 and M3 being trunked via base stations B3 and B4 which are interconnected via land lines L.

In such a system, where the transmitter is equipped with an amplifier embodying the present invention, the associated receiver at that base station or mobile may be provided with a received signal strength detector to monitor the signal strength of the incoming signal to which the transmit is being used to respond. The power level used by the associated amplifier in that base station or mobile may then be set in accordance with the received signal strength, so that the transmitter power is increased as the received signal decreases.

We claim:

1. A power amplifier comprising an input terminal for receiving an input signal to be amplified, a forward amplification path connected to said input terminal and having a power amplifier output stage having an output, a feedback path from the output of said power amplifier output stage for feeding back a feedback signal proportional to the output signal of the output of the power amplifier output stage and having a variable gain amplifier for amplifying the feedback signal, difference means for driving the forward amplification path with a difference signal formed as the difference between the input signal to be amplified and the feedback signal and means connected to the forward and feedback paths for controlling the output power of the output stage, comprising control means for controlling, in a coordinated manner, the degree of attenuation of the signals in the forward path and the degree of amplification of the signals in the feedback path, in accordance with the signal representing a required output power level.

2. A power amplifier according to claim 1 wherein the degrees of attenuation and amplification are varied in inverse proportion to one another.

3. A power amplifier according to claim 1 which is a Cartesian amplifier having respective forward and feedback paths for "real" and "imaginary" quadrature signals.

4. A power amplifier according to claim 3 in which the controlling means controls the attenuation of both quadrature forward paths and the amplification in both quadrature feedback paths.

5. A power amplifier according to claim 1 and including a look-up table connected to the forward amplification path for converting the level of the signal representing the required output power level to a value used to establish the degree of attenuation in the forward path which compensates for variations in the forward path gain with power level.

6. A power amplifier according to claim 1 wherein the degree of attenuation of signals in the forward amplification path and the degree of amplification of signals in the feedback path are both continuously variable.

7. A radio transmitter comprising a converter having an output, for frequency translating at least one signal at baseband frequencies to transmission frequencies and at least one power amplifier connected to the output of said converter for power amplifying a signal which has been frequency translated by said converter for radiation via an aerial, the at least one amplifier comprising an input terminal for receiving a signal from the converter to be amplified, a forward amplification path connected to the input terminal and having a power amplifier output stage having an output, a feedback path from the output of the power amplifier output stage and having a variable gain amplifier for amplifying the feedback signal and means connected to the forward and feedback paths for controlling the output power of the output stage, comprising control means for controlling, in a coordinated manner, the degree of attenuation of signals in the forward path and the degree of amplification in the feedback path, in accordance with a signal representing a required output power level.

8. A radio transmitter according to claim 7, including a monitor for monitoring the output level of the at least one power amplifier, the monitor having an output to be used to control said controller such that an output signal of the transmitter is set to a desired level.

9. A radio communication system comprising a number of transceivers, at least one of the transceivers having at least one transmitter and at least one receiver, the at least one transmitter comprising a converter having an output, for frequency translating at least one signal at baseband frequencies to transmission frequencies and at least one power amplifier connected to the output of said converter for power amplifying a signal which has been frequency translated by said converter for radiation via an aerial, the at least one amplifier comprising an input terminal for receiving an input signal, from the converter, to be amplified, a forward amplification path connected to the input terminal and having a power amplifier output stage having an output, a feedback path from the output of said power amplifier output stage for feeding back a feedback signal proportional to the output signal of the output of the power amplifier output stage and having a variable gain amplifier for amplifying the feedback signal, difference means for driving the forward amplification path with a difference signal formed as the difference between the input signal to be amplified and the feedback signal and means for controlling the output power of the output stage, comprising control means for controlling, in a coordinated manner, a degree of attenuation of the signals in the forward path and the degree of amplification of the signals in the feedback path, in accordance with a signal representing a required output power level.

10. A system according to claim 9 which is operative to transmit a number of channels of communication signals which are frequency division multiplexed.

11. A system according to claim 9 which is operative to transmit a number of channel of communication signals which are time division multiplexed.

12. A system according to claim 9 which is operative to transmit a number of channels of communication signals which are code division multiplexed.

13. A system according to claim 9 which is operative as a trunked radio communication system.

* * * * *

UNITED STATES PATENT AND TRADEMARK OFFICE
CERTIFICATE OF CORRECTION

PATENT NO. : 5,507,017
DATED : April 9, 1996
INVENTOR(S) : Whitmarsh, et al

It is certified that error appears in the above-indentified patent and that said Letters Patent is hereby corrected as shown below:

On the Title Page under Attorney, Agent, or Firm, "Harness, Dickey & Pierce" should be --Harness, Dickey & Pierce, P.L.C.--.

Column 1, between lines 29 and 30, insert --2. Description of the Prior Art--.

Column 3, line 5, "EMBODIMENT" should be --EMBODIMENTS--.

Signed and Sealed this

Sixteenth Day of July, 1996

Attest:

BRUCE LEHMAN

Attesting Officer        Commissioner of Patents and Trademarks